United States Patent
Yang

(10) Patent No.: US 10,629,772 B2
(45) Date of Patent: Apr. 21, 2020

(54) OPTOELECTRONIC DEVICE AND METHOD FOR FABRICATING THE SAME

(71) Applicant: HONGIK UNIVERSITY INDUSTRY-ACADEMIA COOPERATION FOUNDATION, Seoul (KR)

(72) Inventor: Hee-Sun Yang, Seoul (KR)

(73) Assignee: HONGIK UNIV INDUSTRY-ACADEMIA COOP. FOUNDATION, Seoul (KR)

( * ) Notice: Subject to any disclaimer, the term of this patent is extended or adjusted under 35 U.S.C. 154(b) by 0 days.

(21) Appl. No.: 16/132,244

(22) Filed: Sep. 14, 2018

(65) Prior Publication Data
US 2020/0028025 A1    Jan. 23, 2020

(30) Foreign Application Priority Data
Jul. 20, 2018    (KR) .................. 10-2018-0084789

(51) Int. Cl.
*H01L 33/06* (2010.01)
*H01L 33/00* (2010.01)
*H01L 33/26* (2010.01)

(52) U.S. Cl.
CPC ............ *H01L 33/06* (2013.01); *H01L 33/005* (2013.01); *H01L 33/26* (2013.01)

(58) Field of Classification Search
None
See application file for complete search history.

(56) References Cited

U.S. PATENT DOCUMENTS

| | | | |
|---|---|---|---|
| 6,452,206 B1 * | 9/2002 | Harman | H01L 35/16 257/17 |
| 2007/0051963 A1 * | 3/2007 | Chen | B82Y 20/00 257/96 |

(Continued)

FOREIGN PATENT DOCUMENTS

| | | |
|---|---|---|
| KR | 2002-0095769 A | 12/2002 |
| KR | 10-0380585 B1 | 4/2003 |

(Continued)

OTHER PUBLICATIONS

Pan et al. "Doping Lanthanide into Perovskite Nanocrystals: Highly Improved and Expanded Optical Properties", Nano Lett. 2017, 17, 8005-8011, © 2017 American Chemical Society (Year: 2017).*

(Continued)

*Primary Examiner* — Sitaramarao S Yechuri
(74) *Attorney, Agent, or Firm* — Knobbe Martens Olson & Bear LLP

(57) ABSTRACT

Disclosed is an optoelectronic device including a lanthanum-based active layer and a method for fabricating the same. The optoelectronic device includes an active layer of multiple quantum well (MQW) structure including each well between walls, wherein the wall is a dielectric layer selected from alkali metal halide, alkali earth metal halide, alkali metal chalcogenide and alkali earth metal chalcogenide, and the well is a layer including semiconductor selected from lanthanum-based metal halide, lanthanum-based metal chalcogenide, transition metal (including post transition metal) halide and transition metal chalcogenide. The optoelectronic device including the active layer can be used in applications of LEDs, displays, optical sensors and solar cells. When the active layer is used as a photoconversion layer, displays can be implemented by upconversion or downconversion of (Continued)

short wavelength of UV, blue and IR light source to visible wavelength of red, green and blue.

8 Claims, 9 Drawing Sheets

(56) References Cited

U.S. PATENT DOCUMENTS

| | | | |
|---|---|---|---|
| 2010/0313940 A1 | 12/2010 | Wehrspohn et al. | |
| 2013/0077648 A1* | 3/2013 | Felder | B82Y 20/00 |
| | | | 372/75 |
| 2016/0149145 A1* | 5/2016 | Mhaisalkar | H01L 51/0091 |
| | | | 136/263 |
| 2016/0276628 A1* | 9/2016 | Fogel | H01L 51/5275 |
| 2016/0326430 A1* | 11/2016 | Fiedler | C09K 11/7728 |
| 2017/0104050 A1* | 4/2017 | Yamazaki | H01L 27/3211 |
| 2019/0096318 A1* | 3/2019 | Kim | G09G 3/32 |

FOREIGN PATENT DOCUMENTS

| | | |
|---|---|---|
| KR | 10-2010-0056572 A | 5/2010 |
| KR | 10-1423476 B1 | 7/2014 |
| KR | 10-1845470 B1 | 4/2018 |

OTHER PUBLICATIONS

Alekhin et al., "Optical and scintillation properties of SrI2:Yb2+", Optical Materials, vol. 37—5 pages (2014).

Alekhin et al., "Luminescence and spectroscopic properties of Sm2+ and Er3+ doped SrI2", Journal of Luminescence, vol. 167—5 pages (2015).

Filip et al., "Steric engineering of metal-halide perovskites with tunable optical band gaps", Nature Communications—9 pages (Dec. 15, 2014).

* cited by examiner

OPTOELECTRONIC DEVICE AND METHOD FOR FABRICATING THE SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

STATEMENT REGARDING PRIOR DISCLOSURES BY THE INVENTOR OR A JOINT INVENTOR UNDER 37 CFR 1.77(b)(6)

Korean Patent No. 10-185470 titled "OPTOELECTRONIC DEVICE AND METHOD FOR FABRICATING THE SAME" was granted on Mar. 29, 2018 and published on Apr. 5, 2018. The subject matter of Korean Patent No. 10-185470 is related to the present application. The sole inventor of Korean Patent No. 10-185470, Hee-Sun Yang, is the sole inventor of the present application. A copy of Korean Patent No. 10-185470 is being submitted with an Information Disclosure Statement filed herewith.

FIELD OF THE DISCLOSURE

The present disclosure relates to an active layer, an optoelectronic device including the active layer and a method for fabricating the same. More particularly, the present disclosure relates to an optoelectronic device including an active layer having changes in composition and structure and a method for fabricating the same.

DESCRIPTION OF THE RELATED ART

An optoelectronic device is a device that converts electrical energy to electromagnetic waves (primarily, visible light) or vice versa. The types of optoelectronic devices include light emitting devices, photoconversion devices, solar cells and optical sensors, and an active layer where conversion occurs is called an emitting layer of a light emitting device, a photoconversion layer of a photoconversion device, and a light absorbing layer of a solar cell and an optical sensor.

A light emitting device, for example, a light-emitting diode (LED) is an electronic device that emits an electromagnetic wave in the form of visible light when voltage is applied across an active layer between the anode and the cathode. The LED typically includes at least one layer of semiconductor material, in which recombination between electrons supplied from the cathode and holes supplied from the anode takes place. Because recombination between electrons and holes takes place in the active layer of the LED, energy emits in the form of photons emitted from the active layer of the LED, and the active layer is called an emitting layer.

SUMMARY OF THE DISCLOSURE

The present disclosure is directed to providing an optoelectronic device including a new active layer (emitting layer) and a method for fabricating the same.

One aspect provides an optoelectronic device that includes an active layer of multiple quantum well (MQW) structure including each well between walls, wherein the wall is a dielectric layer selected from alkali metal halide, alkali earth metal halide, alkali metal chalcogenide and alkali earth metal chalcogenide, and the well is a layer including semiconductor selected from lanthanum-based metal halide, lanthanum-based metal chalcogenide, transition metal (including post transition metal) halide and transition metal chalcogenide.

The optoelectronic device has a multiple quantum well structure artificially made by forming each of the wall and the well, and in the following embodiment, it is called type 1 device. The well may be a layer made of the semiconductor or a layer doped with an activator selected from lanthanum-based metal, transition metal, the semiconductor and a nitrogen group compound of transition metal using the dielectric as host.

The well may include an organic emissive dopant.

The dielectric may have chemical formula of $AH$, $A_2C$, $EH_2$ or $EC$, and the activator may have chemical formula of $L$, $C$, $LH_2$, $LH_3$, $LH_4$, $LC$, $LC_2$, $L_2C_3$, $TH$, $TH_2$, $TH_3$, $TH_4$, $TC$ or $TP$. Here, A is alkali metal (Li, Na, K, Rb, Cs, Fr), E is alkali earth metal (Be, Mg, Ca, Sr, Ba, Ra), H is halogen (F, Cl, Br, I), C is chalcogen (O, S, Se, Te, Po), L is lanthanum-based metal (La, Ce, Pr, Nd, Pm, Sm, Eu, Gd, Tb, Dy, Ho, Er, Tm, Yb, Lu), T is transition metal (Al, Ga, In, Cu, Ag, Au, Zn, Ni, Pb, Pt, Co, Rh, Ir, Fe, Ru, Ir, Fe, Ru, Os, Mn, Tc, Re, Cr, Mo, W, V, Nb, Ta, Ti, Zr, Hf, Sn, Ge), and P is a nitrogen group, called group 15 or pnictogens (N, P, As, Sb).

Another aspect provides an optoelectronic device that includes an active layer in which halide or chalcogenide including at least one of alkali metal and alkali earth metal is doped or alloyed with lanthanum-based metal, wherein the active layer has a perovskite structure.

The perovskite structure itself may be regarded as a multiple quantum well structure, and the optoelectronic device including the active layer of this perovskite structure is called type 2 device in the following embodiment to distinguish from type 1 device.

In addition, the optoelectronic device may further include dielectric layers selected from alkali metal halide, alkali earth metal halide, alkali metal chalcogenide and alkali earth metal chalcogenide, with the active layer interposed between.

Additionally, here, the active layer may include an organic emissive dopant.

The active layer may be a layer doped with an activator selected from lanthanum-based metal, lanthanum-based metal halide and lanthanum-based metal chalcogenide using halide including alkali metal and alkali earth metal as host. In this instance, the host may have chemical formula of $AEH_3$, $A_2EH_4$ or $AE_2H_5$, and the activator may have chemical formula of $L$, $LH_4$, $LC$, $LC_2$, or $L_2C_3$.

As another example, the active layer may be as a result of alloying alkali earth metal of halide including alkali metal and alkali earth metal with lanthanum-based metal substitution, and may have chemical formula of $ALH_3$, $A_2LH_4$ or $AL_2H_5$.

Likewise to the previous description, A is alkali metal (Li, Na, K, Rb, Cs, Fr), E is alkali earth metal (Be, Mg, Ca, Sr, Ba, Ra), L is lanthanum-based metal (La, Ce, Pr, Nd, Pm, Sm, Eu, Gd, Tb, Dy, Ho, Er, Tm, Yb, Lu), H is halogen (F, Cl, Br, I), and C is chalcogen (O, S, Se, Te, Po).

The active layer may have the emission wavelength of 400~750 nm in the near IR range at UV or blue excitation wavelength.

The optoelectronic device may be an LED further including a hole transfer layer to supply hole to the active layer, an electron transfer layer to supply electron to the active layer, and a hole injection layer and an electron injection layer to make smoother hole and electron injection.

In the present disclosure, the optoelectronic device may belong to one of components of displays, solar cells and optical sensors. A display may be based on an OLED, LCD, QLED or perovskite LED. An optical sensor may be implemented of downconversion or upconversion type including UV~IR.

For example, the optoelectronic device may be a photoconversion device having a stack structure of an OLED, QLED or perovskite LED-based optical device, a capping layer, an encapsulation, a color filter and a polarization film, and the active layer may be included in one of the optical device, the capping layer, the encapsulation and the color filter, or the active layer may be included in an interface within the stack structure of the optical device, the capping layer, the encapsulation and the color filter.

As another example, the optoelectronic device is an LCD-based optical device, and is a photoconversion device in which a backlight unit, a liquid crystal panel and a color filter are integrated, and the active layer may be included in the backlight unit or the active layer may be included in the liquid crystal panel and the color filter.

For example, the backlight unit may include a light guide plate and a light source, the active layer may be included on the light guide plate or the light source, and the active layer may be included as a separate film covered with a barrier film or may be deposited directly on the light guide plate or the light source. As another example, the liquid crystal panel may include a thin film transistor substrate and a color filter substrate laminated facing each other with a liquid crystal layer interposed between, and the active layer may be included in the color filter substrate or may be an alternative to the color filter substrate.

The present disclosure also proposes a method for fabricating the optoelectronic device. This fabrication method is characterized by forming the active layer by one of a thermal evaporation method, CVD, PVD, a sintering method, a solution processing method, a precipitation method and a hot-injection method.

In particular, in case that the optoelectronic device is type 1 device, while continuously supplying a raw material of the wall, when supplying the activator by a pulse method through on/off adjustment of the supply of the activator to repeatedly form the wall and the well, the well doped with an activator selected from lanthanum-based metal, transition metal, the semiconductor and a nitrogen group compound of transition metal using the dielectric as host may be formed between walls. Additionally, when forming a film by a thermal evaporation method, a substrate and a crucible are placed on each plate, a shield is installed in the middle of the individual crucible to shield the linearity of the material during thermal evaporation, and the wall and the well are repeatedly formed by moving the plate having the crucible or horizontally moving the plate having the substrate.

The optoelectronic device may be an LED further including a hole injection layer and a hole transfer layer to supply hole to the active layer and an electron injection layer and an electron transfer layer to supply electron to the active layer, and the method may further include forming an anode on a substrate, forming the hole injection layer, the hole transfer layer, the active layer, the electron transfer layer, the electron injection layer and the cathode, and after forming the anode, performing UV ozone treatment, oxygen and hydrogen plasma treatment and halogen surface treatment of the anode surface.

In one embodiment, the method may further include performing an oxygen treatment of the active layer.

The present disclosure proposes an optoelectronic device including an active layer including an alkali metal and alkali earth metal-based dielectric wall and a lanthanum-based metal, transition metal and their compound-based well, and an optoelectronic device including an active layer in which alkali metal and alkali earth metal-based perovskite is doped or alloyed with lanthanum-based metal.

The emission efficiency increases by the multiple quantum well effect, and accordingly a high efficiency long lifetime optoelectronic device can be implemented, and in particular, the optoelectronic device having the active layer according to the present disclosure can be used in applications of LEDs, displays, optical sensors and solar cells. When the active layer according to the present disclosure is used as a photoconversion layer, displays may be implemented by downconversion of short wavelength of UV and blue light source to visible wavelength of red, green and blue. In addition, due to being based on lanthanum-based materials, conversion to colors of visible spectrum is possible by upconversion of IR light source.

The present disclosure is fabricated based on inorganics, and thus is less vulnerable to temperature and moisture than OLEDs. Because the need for single crystal growth is eliminated, it is possible to fabricate an areal emission device without limitation on the substrate. Additionally, because it is also possible to fabricate by a vacuum Processing method, there is an advantage that application of mass production is easier than a solution processing method.

DESCRIPTION OF EMBODIMENTS

Figure 1:
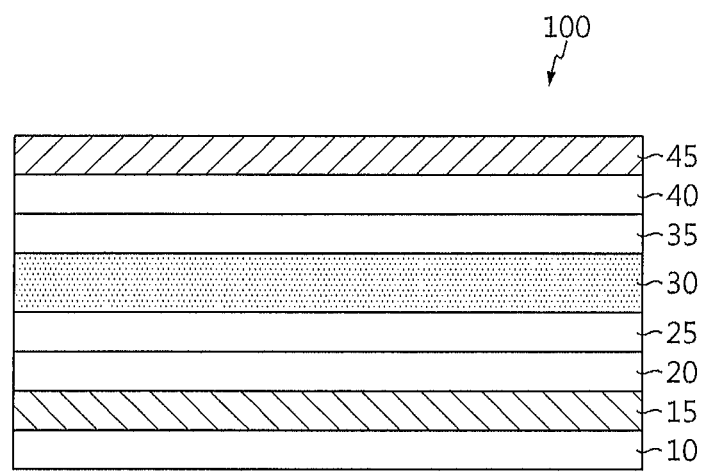
FIG. 1 is a schematic cross-sectional view showing a light emitting diode (LED) including an active layer according to the present disclosure.

Hereinafter, embodiments of the present disclosure will be described in detail with reference to the accompanying drawings. However, the present disclosure is not limited to the disclosed embodiments and will be embodied in many different forms, and this embodiment is provided to make the disclosure complete and help those having ordinary skill in the art to fully understand the scope of the present disclosure.

LEDs may be fabricated, including a wide range of various types of inorganic semiconductor materials including, for example, III-V semiconductor materials and II-VI semiconductor materials. Fabricating LEDs including III-V semiconductor materials, for example, Group-III nitride materials is known in the corresponding field. It is known that Group-III nitride LEDs emit blue and green visible light, and they can operate with higher power and luminous intensity. A typical one of Group-III nitride LEDs is InGaN-based nitride LEDs.

Nitride LEDs have the limited substrate type and growth condition due to epitaxial growth of an active layer (or emitting layer) of single crystals on a sapphire or silicon-based single crystal substrate without lattice defects, and thus they can only be fabricated as a point light emission device. Additionally, a CVD process used in the single crystal growth method has a very high process temperature and needs high-priced raw material and equipment.

Organic LEDs (OLEDs) including an active layer made of a fluorescent or phosphorescent organic thin film are also known. OLEDs are fabricated by selective dense deposition of an organic material on a desired emitter by thermal evaporation, and have an advantage that they achieve areal self-emissive display. However, the organic material itself is vulnerable to oxygen and moisture, making it difficult to ensure reliability, for example, lifetime, and when exposed to high temperature environment, it is more likely to be degraded. OLEDs achieve a single color, for example, white, red, green and blue according to the device type, and there is a limitation on colorful light emissions with desired color purity. Additionally, stability of blue phosphorescence is lower than red and green achieving stable phosphorescence, and high efficiency blue devices remain a challenge.

QLEDs using quantum dots (QD) rather than an organic material as a material of an active layer are known. QLEDs achieve natural colors of desired color purity by adjusting the composition and size of quantum dots and have high color reproducibility and they are not inferior to LEDs in brightness, and much attention is paid to them as a next-generation light source material that can overcome the disadvantage of LEDs. However, they have no material that emits blue, other than environmentally harmful Cd-based quantum dots, and thus the use of a solution processing method and a printing process is required, making application of mass production very difficult.

There are perovskite LEDs that have been developed as light emitting devices by the application to solar cells. They can also achieve desired color purity by the composition of cations and anions in the structure of ABX3, and thus shows the possibility of high quality displays by virtue of color reproducibility that is second only to QLEDs. However, they are fabricated based on environmentally harmful elements Pb and Br like QLEDs, and there is difficulty in the application of mass production in the future.

As described above, the device type and the fabrication method are classified according to the type of the active layer in the field of LEDs, and there have been demands for devices and fabrication methods that have less limitations on the substrate type and growth condition, are less vulnerable to moisture and high temperature, and achieve blue emission and mass production.

A photoconversion device has an active layer including phosphor having red, blue and green emission properties based on an LED light source ensuring stability, and involves absorption of light of UV or blue wavelength from an excitation light source in the active layer, and extraction of the wavelength converted light from the active layer or color mixing. Alternatively, upconversion emission involving upconversion of an IR light source to color of visible spectrum is also included in the photoconversion device. The active layer is also called a photoconversion layer. The phosphor excitation wavelength needs to accurately match the light source wavelength, and when unmatched, the phosphor's excitation efficiency is low and brightness is very low, and there is a limitation that the color coordinate deviation is severe, and accordingly development of an active layer including appropriate phosphor is urgent.

Likewise, there are demands for a new active layer for other optoelectronic devices, for example, solar cells and optical sensors.

Meanwhile, in fabricating inorganic LEDs, it is known that a sandwich- or well-shaped structure in which an active layer of a semiconductor thin film interposed between semiconductor thin films with a larger band gap is useful. For example, a quantum well in Group-III nitride LEDs and a core/shell structure of QLEDs has a structure in which the semiconductor well having a band gap of visible wavelength is present in the wall of a large band gap, and it is the most ideal structure in which electrons and holes meet quantum mechanically. However, two LEDs should achieve epitaxial growth of the well or core material and the wall or shell material to minimize defects, and thus should have a very small extent of non-match in lattice constant between two materials and there is a limitation on material selection. For example, in case of Group-III nitride LEDs, the well/wall material is limited to InGaN/GaN material, and also, in case of QLEDs, the core/shell material is limited to CdSe/CdS/ZnS, CdSe/ZnSe/ZnS or InP/ZnSe/ZnS. The corresponding wall/shell material does not have so large band gap, and thus fails to properly cover the band gap of the well/core material, and even though the band gap is large, a structure that covers both the conduction band (CB) and the valence band (VB) on the basis of the band gap of the well/core material to trap electrons and holes well is required, but when any one is short, failing to cover, quantum efficiency sharply reduces.

For reference, transition metal as used herein is defined as including post transition metal.

FIG. 1 is a schematic cross-sectional view showing an LED including an active layer according to the present disclosure.

As shown in FIG. 1, the LED 100 as an example of an optoelectronic device according to the present disclosure may include a multilayer structure in which an anode 15, a hole injection layer (HIL) 20, a hole transfer layer (HTL) 25, an active layer (an emitting layer; EML) 30, an electron transfer layer (ETL) 35, an electron injection layer (EIL) 40, and a cathode 45 are stacked in that order. Additionally, this multilayer structure may be formed on a substrate 10 acting as a mechanical support. A capping layer/encapsulation may be further formed on the cathode 45.

The substrate 10 may be a glass substrate or a transparent plastic substrate that is transparent and has flat surfaces. The substrate 10 can be used after ultrasonic cleaning with a solvent, for example, isopropylalcohol (IPA), acetone or methanol and UV ozone treatment to remove contaminants. The LED 100 is fabricated as an inorganic LED of an inorganic raw material, but as opposed as typical nitride LEDs, the substrate is not necessarily a single crystal substrate, and thus it is possible to reduce the fabrication costs.

The anode 15 is for hole injection, and the cathode 45 is for electron injection. The anode 15 and the cathode 45 include metal, and are made of inorganics of metal oxide or other non-oxide suitable for each transparent/opaque condition. For bottom emission, the anode 15 may be made of transparent conductive metal such as transparent ITO, ZnO, AZO, FTO, IGZO, GZO, IZO, $C_{60}$, CNT, graphene, graphene oxide, Ag nanowire and PEDOT:PSS, and the cathode 45 may be an electrode of Ag, Mg, Al, Yb, Ca in combination. For top emission, the anode 15 may be made of ITO/Ag/ITO, ITO/Al/ITO, and the cathode 45 may be made of transparent conductive metal such as transparent ITO, ZnO, AZO, FTO, IGZO, GZO and IZO, or may be an electrode of Ag, Mg, Al, Yb, Ca in combination, for example, by deposition of Ag:Mg alloy or Ag:Yb with a small thickness at 150 Å or less.

After the anode 15 is formed on the substrate 10, UV ozone treatment, oxygen and hydrogen plasma treatment, halogen (F, Cl, Br, I) surface treatment of the anode 15 surface may be further included. This treatment can increase the interfacial adhesion with a different layer that will be formed on the anode 15 and adjust the work function of the anode 15 surface. For example, UV ozone treatment may improve interfacial adhesion between the anode 15 and the hole injection layer 20. Also, UV ozone treatment may reduce oxygen vacancy of the anode 15 and form Sn oxide. Thus, UV ozone treatment may increase the work function by Fermi level movement and interface dipole formation, and accordingly reduces the injection barrier at the joint interface between the anode 15 and a different layer that will be formed on the anode 15, making smooth hole injection. This additional treatment of the anode 15 reduces an injection barrier difference between the anode 15 and a different layer (for example, the hole injection layer 20 or the active layer 30) that will be formed on the anode 15, and thus there is an effect that holes can easily enter the active layer 30, thereby improving the emission efficiency. It is proper that this surface treatment adjusts the surface condition or work function by properly selecting according to the VB or HOMO level of an adjacent hole injection layer 20 or hole transfer layer 25.

The hole injection layer 20 and the hole transfer layer 25 play a role in the ease of hole injection from the anode 15, and transfer of holes to the active layer 30. The hole injection layer 20 may be organic HIL material generally used in OLEDs and transition metal, transition metal-based chalcogen (O, S, Se, Te) or halogen (F, Cl, Br, I) ionic compound or the ionic compound itself (CuI, AgI, AuI, $CoI_2$, $NiI_2$, $PtI_2$, CuCl, CuBr, AgCl, AgBr, ZnTe, MgTe, EuTe, YbTe, SmTe, TmTe, DyTe), and OLED organic HIL mixed and doped with organic HIL and HTL. For example, the hole injection layer 20 may include Cu, Ag, Co, Ni, Au, Pt, Ag alloyed with transition metal halide (CuI, AgI, AuI, $CoI_2$, $NiI_2$, $PtI_2$, CuCl, CuBr, AgCl, AgBr) or mixed or doped with transition metal halide, for example, Ag:CuI, Ag:$CoI_2$, Ag:$NiI_2$, Ag:AuI, Ag:$PtI_2$. The corresponding hole injection layer may be used for p-CGL of tandem OLEDs.

The hole transfer layer 25 may be organic HTL material generally used in OLEDs, and transition metal, transition metal-based chalcogen (O, S, Se, Te) or halogen (F, Cl, Br, I) ionic compound itself or OLED organic HTL mixed (co-deposited at a doping ratio or more with existing organic HTL) or doped with the ionic compound. For example, the hole transfer layer 25 may be CuI, AgI, AuI, $CoI_2$, $NiI_2$, $PtI_2$, CuCl, CuBr, AgCl, AgBr, ZnTe, MgTe, EuTe, YbTe, SmTe, TmTe, DyTe, $Cu_2O$, $MoO_3$, $WO_3$, $V_2O_5$, $CrO_3$. The corresponding hole transfer layer may be used asp-CGL of tandem OLED.

The active layer 30 is a layer that emits light by combination of holes and electrons entering respectively from the hole transfer layer 25 and the electron transfer layer 35 and it is relevant to the key subject matter of the present disclosure and will be described in detail as below.

The electron transfer layer 35 plays a role in the facilitation of electron injection from the cathode 45 and transportation of electrons to the active layer 30. The electron transfer layer 35 may be an organic ETL material generally used in OLEDs, an inorganic ETL material and OLED organic ETL doped with an alkali, alkali earth, lanthanum-based metal chalcogen (O, S, Se, Te) or halogen (F, Cl, Br, I) ionic compound. For example, the electron transfer layer 35 may be an OLED organic n-ETL simultaneously doped with Yb, Eu, Sm, $YbI_2$, $EuI_2$, LiCl, NaCl, KCl, RbCl, CsCl, FrCl, LiBr, NaBr, KBr, RbBr, CsBr, FrBr, LiI, NaI, KI, RbI, CsI, FrI. The corresponding electron transfer layer may be used as n-CGL of tandem OLED. For the inorganic ETL, ZnO, $TiO_2$, $SnO_2$, $In_2O_3$, $ZrO_2$, $FeF_2$ may be introduced.

The electron injection layer 40 may be used by doping or alloying lanthanum-based metal (La, Ce, Pr, Nd, Pm, Sm, Eu, Gd, Tb, Dy, Ho, Er, Tm, Yb, Lu) with alkali metal halide (LiCl, NaCl, KCl, RbCl, CsCl). In the lanthanum-based metal, Yb, Eu and Sm have a low work function of 2.6 eV, 2.5 eV and 2.7 eV respectively, making smooth electron injection, and due to higher reaction with halogen than alkali metal, they dissociate LiCl, NaCl, KCl, RbCl, CsCl to turn to a compound, and in this instance, when Li, Na, K, Rb, Cs exist alone, they have a lower work function, and at the same time, form donor in adjacent ETL, thereby further improving the electron injection and electron transfer properties. An amount of injected electrons may be adjusted by a doping amount of alkali and alkali earth metal, and because lanthanum-based metal with a low work function is present in a very high amount of 70 vol % or more, it is different from an active layer with high content of alkali and alkali earth metal compound. The corresponding electron injection layer may be used as n-CGL of tandem OLED.

According to the present disclosure, the active layer 30 may have various structures, and may be fabricated by a variety of fabrication methods. The active layer 30 may be implemented as, for example, an active layer 30a, 30b, 30c, 30d described with reference to FIGS. 2 to 5. Hereinafter, a detailed description is provided.

Figure 2:
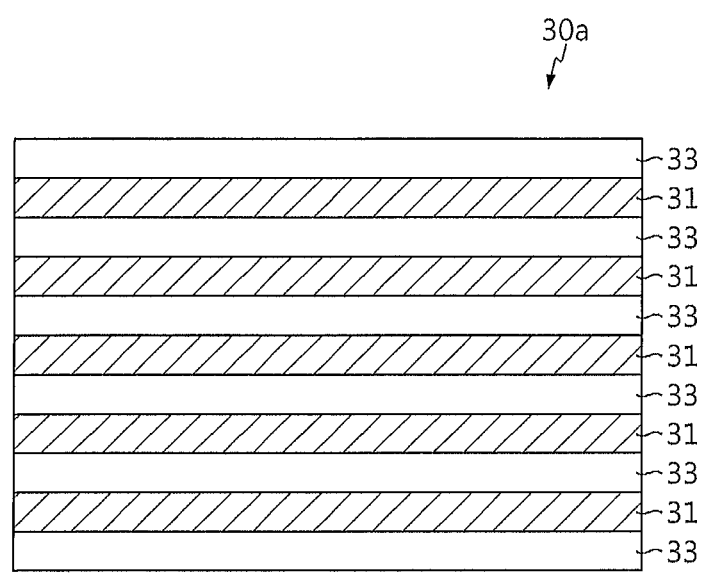
FIG. 2 is a schematic cross-sectional view illustrating an embodiment of the active layer included in the LED of FIG. 1.

FIG. 2 is a schematic cross-sectional view illustrating an embodiment of the active layer included in the LED of FIG. 1.

Here, the active layer 30a has a multiple quantum well (MQW) structure including each well 31 between walls 33, and the wall 33 and the well 31 may be formed by active deposition using a thin film deposition method such as a thermal evaporation method, and the optoelectronic device including the active layer 30a is called type 1.

In type 1 device, the wall 33 is a dielectric layer. The dielectric is formed from alkali metal or alkali earth metal halide or chalcogenide. Accordingly, the dielectric is selected from alkali metal halide, alkali earth metal halide, alkali metal chalcogenide and alkali earth metal chalcogenide.

The well 31 is a layer including semiconductor. The semiconductor may include lanthanum-based metal or transition metal (including post transition metal) halide or chalcogenide. That is, the well 31 is a layer including semiconductor selected from lanthanum-based metal halide, lanthanum-based metal chalcogenide, transition metal halide and transition metal chalcogenide.

In this instance, the well 31 may be a layer formed only from the semiconductor, and may be a layer doped using the dielectric as host and activator selected from lanthanum-based metal, transition metal, the semiconductor and a nitrogen group compound of transition metal.

That is, in an implementation example, the wall 33/well 31 is a dielectric/semiconductor structure, and in another implementation example, the wall 33/well 31 is dielectric/dielectric host:activator.

The alkali metal is one of Li, Na, K, Rb, Cs and Fr. The alkali earth metal is one of Be, Mg, Ca, Sr, Ba and Ra. The halogen is one of F, Cl, Br and I, and the chalcogen is one of O, S, Se, Te and Po. When the alkali metal is indicated by A, the alkali earth metal is indicated by E, the halogen is indicated by H and the chalcogen is indicated by C, the dielectric that forms the wall 33 has the chemical formula of AH, $A_2C$, $EH_2$ or EC. This material has a large band gap of 3.5~12 eV or more, which appropriately covers the band gap of the well 31. Due to the structure that covers both the conduction band CB and the valence band VB on the basis of the band gap of the well 31 material, the quantum efficiency can be maintained on very high level.

The material such as AH, $A_2C$, $EH_2$ or EC is a material of a large band gap that was not used in existing LEDs. Completely trapping electrons and holes in the well 31 by using this for the wall 33 of multiple quantum well structure is one of the features of the present disclosure.

Examples of dielectric that can be used for the wall 33 may be listed as follows:

Examples of AH: LiF, NaF, KF, RbF, CsF, FrF, LiCl, NaCl, KCl, RbCl, CsCl, FrCl, LiBr, NaBr, KBr, RbBr, CsBr, FrBr, LiI, NaI, KI, RbI, CsI, FrI.

Examples of $A_2C$: $Li_2O$, $Na_2O$, $K_2O$, $Rb_2O$, $Cs_2O$, $Fr_2O$, $Li_2S$, $Na_2S$, $K_2S$, $Rb_2S$, $Cs_2S$, $Fr_2S$, $Li_2Se$, $Na_2Se$, $K_2Se$, $Rb_2Se$, $Cs_2Se$, $Fr_2Se$, $Li_2Te$, $Na_2Te$, $K_2Te$, $Rb_2Te$, $Cs_2Te$, $Fr_2Te$.

Examples of $EH_2$: $MgF_2$, $CaF_2$, $BaF_2$, $SrF_2$, $RaF_2$, $MgCl_2$, $CaCl_2$, $BaCl_2$, $SrCl_2$, $RaCl_2$, $MgBr_2$, $CaBr_2$, $BaBr_2$, $SrBr_2$, $RaBr_2$, $MgI_2$, $CaI_2$, $BaI_2$, $SrI_2$, $RaI_2$.

Examples of EC: MgO, CaO, BaO, SrO, RaO, MgS, CaS, BaS, SrS, RaS, MgSe, CaSe, BaSe, SrSe, RaSe, MgTe, CaTe, BaTe, SrTe, RaTe.

The lanthanum-based metal is one of La, Ce, Pr, Nd, Pm, Sm, Eu, Gd, Tb, Dy, Ho, Er, Tm, Yb and Lu. The transition metal (including post transition metal) is one of Al, Ga, In, Cu, Ag, Au, Zn, Ni, Pb, Pt, Co, Rh, Ir, Fe, Ru, Ir, Fe, Ru, Os, Mn, Tc, Re, Cr, Mo, W, V, Nb, Ta, Ti, Zr, Hf, Sn and Ge. When the lanthanum-based metal is indicated by L, the transition metal is indicated by T, the halogen is indicated by H and the chalcogen is indicated by C, semiconductor that can form the well 31 has the chemical formula of $LH_2$, $LH_3$, $LH_4$, LC, $LC_2$, $L_2C_3$, TH, $TH_2$, $TH_3$, $TH_4$, TC or TP. In particular, the well 31 formed only from transition metal halide or chalcogenide TH, $TH_2$, $TH_3$, $TH_4$ or TC advantageously has good emission properties.

In an implementation embodiment in which the wall 33/well 31 is a dielectric/semiconductor structure, the well 31 is a layer that is formed only from semiconductor and emits light. For example, examples of available semiconductors may be listed as follows:

Examples of $LH_2$: $LaF_2$, $CeF_2$, $PrF_2$, $NdF_2$, $PmF_2$, $SmF_2$, $EuF_2$, $GdF_2$, $TbF_2$, $DyF_2$, $HoF_2$, $ErF_2$, $TmF_2$, $YbF_2$, $LuF_2$, $LaCl_2$, $CeCl_2$, $PrCl_2$, $NdCl_2$, $PmCl_2$, $SmCl_2$, $EuCl_2$, $GdCl_2$, $TbCl_2$, $DyCl_2$, $HoCl_2$, $ErCl_2$, $TmCl_2$, $YbCl_2$, $LuCl_2$, $LaBr_2$, $CeFBr_2$, $PrBr_2$, $NdBr_2$, $PmBr_2$, $SmBr_2$, $EuBr_2$, $GdBr_2$, $TbBr_2$, $DyBr_2$, $HoBr_2$, $ErBr_2$, $TmBr_2$, $YbBr_2$, $LuBr_2$, $LaI_2$, $CeI_2$, $PrI_2$, $NdI_2$, $PmI_2$, $SmI_2$, $EuI_2$, $GdI_2$, $TbI_2$, $DyI_2$, $HoI_2$, $ErI_2$, $TmI_2$, $YbI_2$, $LuI_2$.

Examples of $LH_3$: $LaF_3$, $CeF_3$, $PrF_3$, $NdF_3$, $PmF_3$, $SmF_3$, $EuF_3$, $GdF_3$, $TbF_3$, $DyF_3$, $HoF_3$, $ErF_3$, $TmF_3$, $YbF_3$, $LuF_3$, $LaCl_3$, $CeCl_3$, $PrCl_3$, $NdCl_3$, $PmCl_3$, $SmCl_3$, $EuCl_3$, $GdCl_3$, $TbCl_3$, $DyCl_3$, $HoCl_3$, $ErCl_3$, $TMCl_3$, $YbCl_3$, $LuCl_3$, $LaBr_3$, $CeBr_3$, $PrBr_3$, $NdBr_3$, $PmBr_3$, $SmBr_3$, $EuBr_3$, $GdBr_3$, $TbBr_3$, $DyBr_3$, $HoBr_3$, $ErBr_3$, $TmBr_3$, $YbBr_3$, $LuBr_3$, $LaI_3$, $CeI_3$, $PrI_3$, $NdI_3$, $PmI_3$, $SmI_3$, $EuI_3$, $GdI_3$, $TbI_3$, $DyI_3$, $HoI_3$, $ErI_3$, $TmI_3$, $YbI_3$, $LuI_3$.

Examples of LC: LaO, CeO, PrO, NdO, PmO, SmO, EuO, GdO, TbO, DyO, HoO, ErO, TmO, YbO, LuO, LaS, CeS, PrS, NdS, PmS, SmS, EuS, GdS, TbS, DyS, HoS, ErS, TmS, YbS, LuS, LaSe, CeSe, PrSe, NdSe, PmSe, SmSe, EuSe, GdSe, TbSe, DySe, HoSe, ErSe, TmSe, YbSe, LuSe, LaTe, CeTe, PrTe, NdTe, PmTe, SmTe, EuTe, GdTe, TbTe, DyTe, HoTe, ErTe, TmTe, YbTe, LuTe.

Examples of $L_2C_3$: $La_2O_3$, $Ce_2O_3$, $Pr_2O_3$, $Nd_2O_3$, $Pm_2O_3$, $Sm_2O_3$, $Eu_2O_3$, $Gd_2O_3$, $Tb_2O_3$, $Dy_2O_3$, $Ho_2O_3$, $Er_2O_3$, $Tm_2O_3$, $Yb_2O_3$, $Lu_2O_3$, $La_2S_3$, $Ce_2S_3$, $Pr_2S_3$, $Nd_2S_3$, $Pm_2S_3$, $Sm_2S_3$, $Eu_2S_3$, $Gd_2S_3$, $Tb_2S_3$, $Dy_2S_3$, $Ho_2S_3$, $Er_2S_3$, $Tm_2S_3$, $Yb_2S_3$, $Lu_2S_3$, $La_2Se_3$, $Ce_2Se_3$, $Pr_2Se_3$, $Nd_2Se_3$, $Pm_2Se_3$, $Sm_2Se_3$, $Eu_2Se_3$, $Gd_2Se_3$, $Tb_2Se_3$, $Dy_2Se_3$, $Ho_2Se_3$, $Er_2Se_3$, $Tm_2Se_3$, $Yb_2Se_3$, $Lu_2Se_3$, $La_2Te_3$, $Ce_2Te_3$, $Pr_2Te_3$, $Nd_2Te_3$, $Pm_2Te_3$, $Sm_2Te_3$, $Eu_2Te_3$, $Gd_2Te_3$, $Tb_2Te_3$, $Dy_2Te_3$, $Ho_2Te_3$, $Er_2Te_3$, $TM_2Te_3$, $Yb_2Te_3$, $Lu_2Te_3$.

Examples of TR CuF, AgF, AuF, CuCl, AgCl, AuCl, CuBr, AgBr, AuBr, CuI, AgI, AuI.

Examples of $TH_2$: $ZnF_2$, $NiF_2$, $PbF_2$, $PtF_2$, $CoF_2$, $RhF_2$, $IrF_2$, $FeF_2$, $RuF_2$, $IrF_2$, $FeF_2$, $RuF_2$, $OsF_2$, $MnF_2$, $TcF_2$, $ReF_2$, $GeF_2$, $SnF_2$, $ZnCl_2$, $NiCl_2$, $PbCl_2$, $PtCl_2$, $COCl_2$, $RhCl_2$, $IrCl_2$, $FeCl_2$, $RaCl_2$, $IrCl_2$, $FeCl_2$, $OsCl_2$, $MnCl_2$, $TeCl_2$, $ReCl_2$, $SnCl_2$, $GeCl_2$, $ZnBr_2$, $NiBr_2$, $PbBr_2$, $PtBr_2$, $CoBr_2$, $RhBr_2$, $IrBr_2$, $FeBr_2$, $RuBr_2$, $IrBr_2$, $FeBr_2$, $RuBr_2$, $OsBr_2$, $MnBr_2$, $TeBr_2$, $ReBr_2$, $SnBr_2$, $GeBr_2$, $ZnI_2$, $NiI_2$, $PbI_2$, $PtI_2$, $CoI_2$, $RhI_2$, $IrI_2$, $FeI_2$, $RuI_2$, $OsI_2$, $MnI_2$, $TcI_2$, $SnI_2$, $ReI_2$, $GeI_2$.

Examples of $TH_3$:$CrF_3$, $MoF_3$, $WF_3$, $VF_3$, $NbF_3$, $TaF_3$, $CrCl_3$, $MoCl_3$, $WCl_3$, $VCl_3$, $NbCl_3$, $TaCl_3$, $CrBr_3$, $MoBr_3$, $WBr_3$, $VBr_3$, $NbBr_3$, $TaBr_3$, $CrI_3$, $MoI_3$, $WI_3$, $VI_3$, $NbI_3$, $TaI_3$.

Examples of $TH_4$:$TiF_4$, $ZrF_4$, $HfF_4$, $SnF_4$, $GeF_4$, $TiCl_4$, $ZrCl_4$, $HfCl_4$, $SnCl_4$, $GeCl_4$, $TiBr_4$, $ZrBr_4$, $HfBr_4$, $SnBr_4$, $GeBr_4$, $TiI_4$, $ZrI_4$, $HfI_4$, $SnI_4$, $GeI_4$.

Examples of TC: ZnS, ZnSe, ZnTe.

Examples of TP: GaN, AlN, InN, GaP, AlP, InP, GaAs, AlAs, InAs.

In a second embodiment in which the wall 33/well 31 is dielectric/dielectric host:activator, the well 31 is doped using dielectric AH, $A_2C$, $EH_2$ or EC, and lanthanum-based metal L, transition metal T or semiconductor $LH_2$, $LH_3$, $LH_4$, LC, $LC_2$, $L_2C_3$, TH, $TH_2$, $TH_3$, $TH_4$, TC or TP as activator. As previously mentioned, the material such as AH, $A_2C$, $EH_2$ or EC is a material of a large band gap that was not used in typical LEDs. In addition, another feature of the present disclosure is formation of the well 31 by doping an activator such as L, T, $LH_2$, $LH_3$, $LH_4$, LC, $LC_2$, $L_2C_3$, TH, $TH_2$, $TH_3$, $TH_4$, TC or TP to AH, $A_2C$, $EH_2$ or EC.

Here, the well 31 may include an organic emissive dopant. Its detailed description will be provided later.

The active layer 30a may have one crystal phase of amorphous, polycrystalline and single crystal. Additionally, the active layer 30a may have at least one crystal structure of perovskite, orthorhombic system, tetragonal system, cubic system of body center cubic (BCC) structure or face centered cubic (FCC) structure, hexagonal close packed (HCP) structure and monoclinic system. In implementing the multiple quantum well formed by a sequential deposition method, amorphous phase is the most suitable.

The wavelength of light emitted from any specified LED is a function of an amount of energy emitted upon recombination between electrons and holes. Accordingly, the wavelength of light emitted from LED is a function of a relative difference in energy between energy level of electron and energy level of hole. The energy level of electron and the energy level of hole are at least partially a function of composition of host, the doping type and concentration of host through activator, reconstruction (i.e., crystal structure and orientation), and quality of the active layer where recombination between electrons and holes takes place. Accordingly, the wavelength of light emitted from the LED may be selectively adjusted by selectively adjusting the composition and components of the active layer within the LED.

The active layer 30a does not particularly need to be a single crystal, and is different from typical nitride-based inorganic LEDs. Even in the case of amorphous, it was experimentally demonstrated that satisfactory level of emission could be obtained. Accordingly, there is no need for a substrate and a process required to obtain a single crystal.

Typically, to achieve a multiple quantum well structure, it is required that the well and the wall are epitaxially grown with the substrate, and thus the extent of mismatch between lattice constant between two materials should be very small, and accordingly, there is a limitation on material selection. Even though a material combination with small lattice constant mismatch is selected, because the corresponding wall material does not have quite a large band gap, it fails to appropriately cover the band gap of the well. In contrast, the present disclosure has not limitation such as epitaxial growth in forming the well and wall. Accordingly, various material combinations are possible, and in particular, the present disclosure proposes alkali metal, alkali earth metal-based halide or chalcogenide having a very large band gap for the wall, so even when the well capable of desired wavelength range of emission is freely selected, it is possible to form the wall with a structure covering both the conduction band (CB) and the valence band (VB), thereby achieving high quantum efficiency. This leads to high emission efficiency.

In the composition of the well 31 taken as an example in the foregoing description, an example of dielectric host: activator, LiI:Eu, overlaps with scintillator phosphor used for gamma ray and X-ray detection. However, the scintillator phosphor should be powder of single crystal. Additionally, the scintillator phosphor emits light in response to gamma rays and X-rays. The well 31 used in the present disclosure is formed as a film on any substrate such as the substrate and does not need to be a single crystal, and in the case of an amorphous film, higher full width at half maximum (FWHM) can be obtained and emission properties are good. The powder of single crystal serving as the scintillator phosphor may be polycrystalline of multicrystalline system, and in the case of polycrystalline, the FWHM of wavelength is widened by lattice defects.

Even in the case of amorphous, the present disclosure can obtain high color reproducibility due to narrow FWHM. Additionally, distinction of the present disclosure is the well 31 of the present disclosure being surrounded by the wall 33 such as AH, $A_2C$, $EH_2$ or EC having larger band gap, and used as the active layer 30a of multiple quantum well structure. The active layer 30a configured as above emits light by recombination between electrons and holes, or the active layer 30a uses UV, near ultraviolet and blue light as an excitation source. Accordingly, the scintillator phosphor and the well 31 of the present disclosure are used in completely different applications. Accordingly, the scintillator phosphor material and the well 31 material of the present disclosure are completely different compounds. The well 31 material of the present disclosure can be efficiently produced at reasonable costs, and eliminates the need for high quality single crystal growth.

Additionally, it should be distinguished from an example of using a material having a low work function of 3 eV or less, for example, some of alkali and alkali earth metal halide, for the material of the electron injection layer in existing OLEDs. The active layer 30a of the present disclosure basically uses dielectric of 3.5~12 eV or more for the wall 33, and besides, includes the well 31 formed from lanthanum-based metal or transition metal halide or chalcogenide, or even the well 31 formed by host:activator doping using the dielectric as host and lanthanum-based metal or transition metal or their halide or chalcogenide as activator.

The active layer 30a of the above-described composition and components may be formed by all types of thin film deposition methods and film forming methods. The active layer 30a may be formed not only by a method such as CVD but also one of a thermal evaporation method, PVD, a sintering method, a solution processing method, a precipitation method and a hot-injection method. For example, halide as a dielectric and semiconductor raw material has higher reactivity than oxide or nitride used as a raw material of existing inorganic LEDs. In particular, iodine compounds have low dissolution energy and are more prone to spontaneous reaction, and thus the process is possible at lower temperature. Accordingly, a film can be formed by a method such as a 200° C. thermal evaporation method, and substitution reaction with lanthanum-based metal and transition metal is good.

When a method such as CVD is used, the deposition condition may be selected within the range of, for example, deposition temperature of about 100° C. to about 500° C., the degree of vacuum of about $10^{-8}$ to about $10^{-3}$ torr and deposition rate of about 0.01 to about 100 Å/sec, taking into account a compound to deposit and a structure to form. The solution processing method may be performed by a method including preparing a solution of raw material mixture, spin coating and thermal treatment. For example, the coating condition may be selected within the range of coating speed of about 2000 rpm to about 5000 rpm and thermal treatment temperature of about 80° C. to 200° C., taking into account a compound and structure intended for film formation.

The most preferable film forming method is a thermal evaporation method. Deposition of a thin film using a thermal evaporation method is closer to physical adsorption than chemical adsorption, so crystals pf the film become amorphous and it is not influenced by a lower substrate, and due to amorphization, a film can be formed with less or no point defect or plane defect. Additionally, according to the properties of the material selected by the present disclosure, even an amorphous film has a nearly similar band gap of dielectric and semiconductor to a single crystal (tends to reduce by 0.1~0.2 eV), and thus a recombination rate of injected electrons and holes is very high. Additionally, because halide except fluoride spontaneously reacts with lanthanum-based metal having large reactivity in vacuum without catalyst, it is easy to implement by a vacuum processing method such as a thermal evaporation method.

In type 1 device as shown in FIG. 2, when forming a multiple quantum well structure of repetition of the wall 33/well 31, stacking may be performed by repeating the raw material supply of the wall 33/well 31 in alternating manner. In particular, like the second embodiment, when the composition of the wall 33/well 31 is dielectric/dielectric host:activator, the well 31 may be formed by adding activator to the wall 33 material, and for example, it may be continuously stacking may be performed by continuously supplying the activator by a pulse method through on/off adjustment while continuing the raw material supply of the wall 33. Additionally, when forming a film by a thermal evaporation method, a substrate and a crucible are placed on each plate, shielding is installed in the middle of the individual crucible to shield the linearity of the material during thermal evaporation, and the wall and the well may be repeatedly formed by moving the plate having the crucible or horizontally moving the plate having the substrate.

After the active layer 30a is formed as described above, the step for oxygen treatment may be further included. This step contributes to the activation of the activator. For example, it includes treatment by ultraviolet light irradiation in an atmosphere including ozone, and treatment in a plasma atmosphere including oxygen such as oxygen asher that enables plasma discharge in an atmosphere including oxygen. That is, it is exposed to an atmosphere including atomic active oxygen generated by dissociation of ozone or oxygen. Through this step, the compound-type activator decomposes to cations and anions, and cations substitute or penetrate the cation positions of the host, thereby improving the activation rate.

As described above, according to the present disclosure, it is possible to fabricate the optoelectronic device including the alkali- and alkali earth metal-based dielectric wall and the well based on lanthanum-based metal, transition metal and their compounds using a raw material having good reactivity such as halide raw material by a method such as a thermal evaporation method of low process temperature of about 200° C. The optoelectronic device including the active layer of multiple quantum well structure can be entirely formed from an inorganic material, and without harmful substance for human body such as Cd and Pb, a low temperature process is possible.

Type 1 device is the case in which a multiple quantum well structure is artificially made by forming each of the wall and the well. The perovskite structure itself may be regard as a multiple quantum well structure, and an optoelectronic device including an active layer of this perovskite structure is called type 2 device to distinguish it from type 1.

The perovskite is a structure in which dielectric and semiconductor coexist with a very small thickness, and thus it is considered to be a structure already including multiple quantum wells. In existing semiconductor materials, for example, $CsPbX_3$ is a perovskite structure. In the perovskite structure, a compound of divalent cations determines the band gap, and all perovskite compounds that have been used as a semiconductor material exhibit band gaps in the visible wavelength. In the present disclosure, perovskite used for the active layer uses alkali metal and alkali earth metal halide or chalcogenide so that the band gap is larger than the visible wavelength, and in addition, lanthanum-based metal induces substitution of divalent cation position of perovskite to construct a system that emits light by another band gap in the band gap, dissimilar to the existing semiconductor materials.

Meanwhile, in the case of type 1 device, the multiple quantum well structure is implemented by stacking along the upward direction from the substrate and thus it is a 2-dimensional structure, and in the case of type 2 device, when it is made of polycrystalline perovskite, the multiple quantum well structure in one crystal is 2-dimensional but because crystals will be randomly placed in many directions, when seeing the entire active layer, 2-dimensional multiple quantum well structures are arranged in three dimensions, and in this point, type 1 device and type 2 device are distinct from each other.

Figure 3:
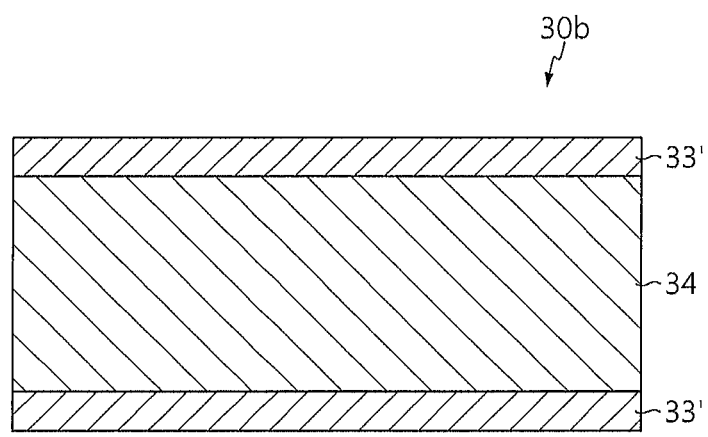
FIG. 3 is a schematic cross-sectional view illustrating another embodiment of the active layer included in the LED of FIG. 1.
Figure 4:
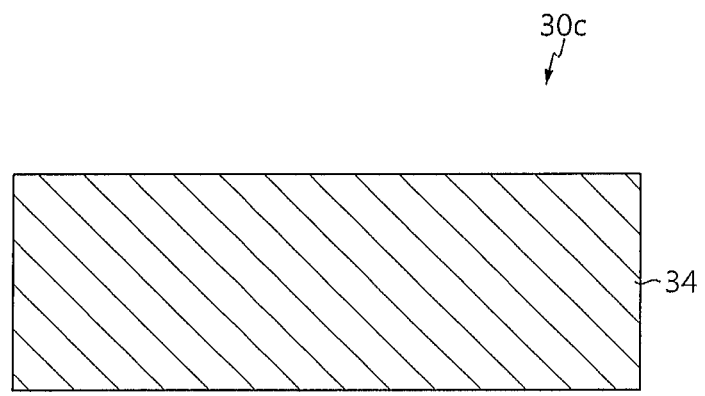
FIG. 4 is a schematic cross-sectional view illustrating still another embodiment of the active layer included in the LED of FIG. 1.
Figure 5:
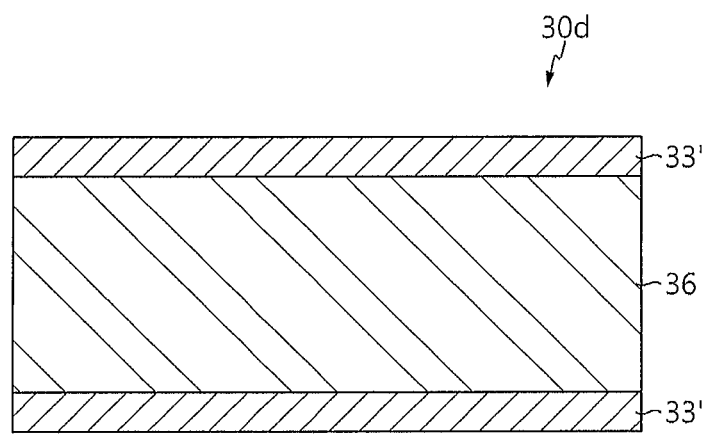
FIG. 5 is a schematic cross-sectional view illustrating yet another embodiment of the active layer included in the LED of FIG. 1.

FIGS. 3 to 5 below introduce various active layers of type 2 device.

First, FIG. 3 is a schematic cross-sectional view illustrating another embodiment of the active layer included in the LED of FIG. 1.

Referring to FIG. 3, the active layer 30b includes an active layer 34 of halide or chalcogenide including at least one of alkali metal and alkali earth metal doped with lanthanum-based metal between dielectric layers 33'. An appropriate doping rate is 10% or less in mol %. The active layer 34 has a perovskite structure. The dielectric layer 33' and the active layer 34 are also formed by a thin film deposition method such as a thermal evaporation method.

The active layer 34 is a layer doped using halide including alkali metal and alkali earth metal as host and activator selected from lanthanum-based metal, lanthanum-based metal halide and lanthanum-based metal chalcogenide. When the alkali metal is indicated by A, the alkali earth metal is indicated by E, the halogen is indicated by H and the lanthanum-based metal is indicated by L, the host may have the chemical formula of $AEH_3$, $A_2EH_4$ or $AE_2H_5$, and the activator may have the chemical formula of $L$, $LH_2$, $LH_3$, $LH_4$, $LC$, $LC_2$ or $L_2C_3$. The active layer 34 may have one crystal phase of amorphous, polycrystalline and single crystal.

Because the dielectric layer 33' is a dielectric layer that forms the wall 33 in the previous embodiment, the description of the wall 33 in the previous embodiments may be equally applied.

Examples of the host may be listed as follows:

Examples of $AEH_3$: $CsMgF_3$, $CsMgCl_3$, $CsMgBr_3$, $CsMgI_3$, $CsCaF_3$, $CsCaCl_3$, $CsCaBr_3$, $CsCaI_3$, $CsSrF_3$, $CSSrCl_3$, $CsSrBr_3$, $CsSrI_3$, $CsBaF_3$, $CSBaCl_3$, $CsBaBr_3$, $CsBaI_3$, $CsEuF_3$, $CsEuCl_3$, $CsEuBr_3$, $CsEuI_3$.

Examples of $A_2EH_4$: $Cs_2MgF_4$, $Cs_2MgCl_4$, $Cs_2MgBr_4$, $Cs_2MgI_4$, $Cs_2CaF_4$, $Cs_2CaCl_4$, $Cs_2CaBr_4$, $Cs_2CaI_4$, $Cs_2SrF_4$, $Cs_2SrCl_4$, $Cs_2SrBr_4$, $Cs_2SrI_4$, $Cs_2BaF_4$, $Cs_2BaCl_4$, $Cs_2BaBr_4$, $Cs_2BaI_4$, $Cs_2EuF_4$, $Cs_2EuCl_4$, $Cs_2EuBr_4$, $Cs_2EuI_4$.

Examples of $AE_2H_5$: $CsMg_2F_5$, $CsMg_2Cl_5$, $CsMg_2Br_5$, $CsMg_2I_5$, $CsCa_2F_5$, $CsCa_2Cl_5$, $CsCa_2Br_5$, $CsCa_2I_5$, $CsSr_2F_5$, $CsSr_2Cl_5$, $CsSr_2Br_5$, $CsSr_2I_5$, $CsBa_2F_5$, $CsBa_2Cl_5$, $CsBa_2Br_5$, $CsBa_2I_5$, $CsEu_2F_5$, $CsEu_2Cl_5$, $CsEu_2Br_5$, $CsEu_2I_5$.

FIG. 4 is a schematic cross-sectional view illustrating still another embodiment of the active layer included in the LED of FIG. 1.

Referring to FIG. 4, the active layer 30c is only different from FIG. 3 in that it does not include the dielectric layer 33'. The active layer 30c only includes the active layer 34 in which halide or chalcogenide including at least one alkali metal and alkali earth metal is doped with lanthanum-based metal.

In the above description made with reference to FIGS. 3 and 4, the active layer 34 may include an organic emissive dopant. Its detailed description will be provided later.

FIG. 5 is a schematic cross-sectional view illustrating yet another embodiment of the active layer included in the LED of FIG. 1.

Referring to FIG. 5, the active layer 30d includes an active layer 36 alloyed by substituting lanthanum-based metal for alkali earth metal of halide including alkali metal and alkali earth metal between dielectric layers 33'. The active layer 36 has a perovskite structure, and is formed by a thin film deposition method such as a thermal evaporation method.

When the alkali metal is indicated by A, the alkali earth metal is indicated by E, the halogen is indicated by H and the lanthanum-based metal is indicated by L, the active layer 36 has the chemical formula of $ALH_3$, $A_2LH_4$ or $AL_2H_5$. The active layer 36 may have one crystal phase of polycrystalline and single crystal.

Examples of the active layer 36 may be listed as follows:
Examples of $ALH_3$: $CsSmF_3$, $CsSmCl_3$, $CsSmBr_3$, $CsSmI_3$, $CsYbF_3$, $CsYbCl_3$, $CsYbBr_3$, $CsYbI_3$, $CsTmF_3$, $CsTmCl_3$, $CsTmBr_3$, $CsTmI_3$, $CsDyF_3$, $CsDyCl_3$, $CsDyBr_3$, $CsDyI_3$.

Examples of $A_2LH_4$: $Cs_2SmF_4$, $Cs_2SmCl_4$, $Cs_2SmBr_4$, $Cs_2SmI_4$, $Cs_2YbF_4$, $Cs_2YbCl_4$, $Cs_2YbBr_4$, $Cs_2YbI_4$, $Cs_2TmF_4$, $Cs_2TmCl_4$, $Cs_2TmBr_4$, $Cs_2TmI_4$, $Cs_2DyF_4$, $Cs_2DyCl_4$, $Cs_2DyBr_4$, $Cs_2DyI_4$.

Examples of $AL_2H_5$: $CsSm_2F_5$, $CsSm_2Cl_5$, $CsSm_2Br_5$, $CsSm_2I_5$, $CsYb_2F_5$, $CsYb_2Cl_5$, $CsYb_2Br_5$, $CsYb_2I_5$, $CsTm_2F_5$, $CsTm_2Cl_5$, $CsTm_2Br_5$, $CsTm_2I_5$, $CsDy_2F_5$, $CsDy_2Cl_5$, $CsDy_2Br_5$, $CsDy_2I_5$.

Here, the active layer 36 may include an organic emissive dopant. Its detailed description will be provided later.

The above-described type 2 device includes the active layer in which alkali metal- and alkali earth metal-based perovskite is doped or alloyed with lanthanum-based metal. Any type of active layer is implemented by substitution or penetration of lanthanum-based active ion in the perovskite divalent cation position, and achieves fluorescence or phosphorescence emission properties according to 5d->4f transition process with the energy level formed according to $4f^n$->$4f^n$-$15d^1$ behaviors.

Figure 6:
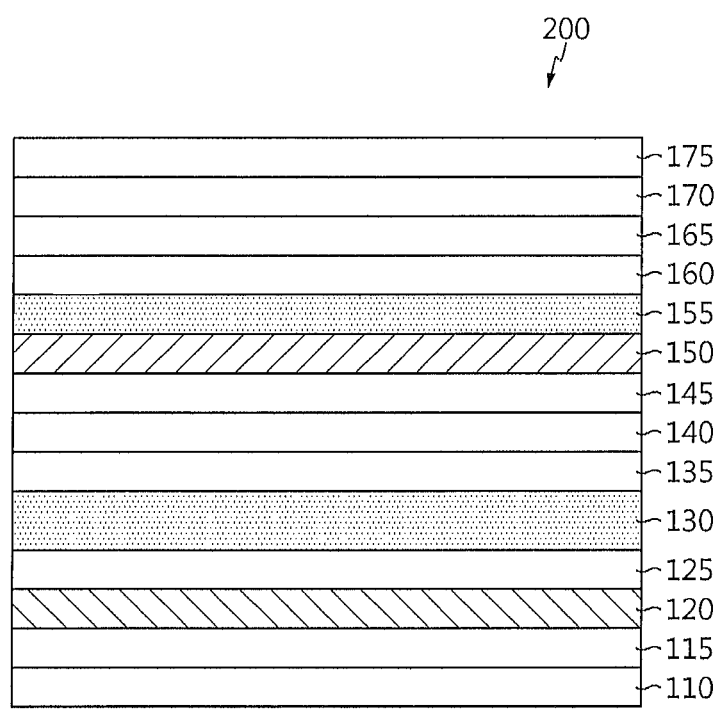
FIG. 6 is a schematic cross-sectional view showing a photoconversion device including an active layer according to the present disclosure.

FIG. 6 is a schematic cross-sectional view showing a photoconversion device including an active layer according to the present disclosure, and shows an OLED device-based photoconversion device.

As shown in FIG. 6, the photoconversion device 200 of the present disclosure may have a stack structure of substrate 110/TFT 115/anode 120/HIL 125/HTL 130/EML (UV, blue emitting layer) 135/ETL 140/EIL 145/cathode 150/capping layer 160/encapsulation 165/color filter 170/polarization film 175.

In the case of bottom emission type, the substrate 110 may be formed from a transparent glass material of which the main component is $SiO_2$. However, the substrate 110 is not necessarily limited thereto, and may be formed from a transparent plastic material. The plastic material for the substrate 110 may be an insulating organic, which may be an organic selected from the group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide (PI), polycarbonate (PC), cellulose triacetate (TAC) and cellulose acetate propionate (CAP). On the contrary, in the case of top emission type, the substrate 110 does not necessarily need to be formed from a transparent material. For example, the substrate 110 may be formed from metal. When the substrate 100 is formed from metal, the substrate 110 may include, but is not limited to, at least one selected from the group consisting of C, Fe, Cr, Mn, Ni, Ti, Mo, stainless steel (SUS), Invar alloy, Inconel alloy and Kovar alloy.

The thin film transistor (TFT) 115 is disposed on the substrate 110. The TFT 115 is electrically connected to an OLED to provide an image that can be perceived by a user. The anode 120/HIL 125/HTL 130/EML 135/ETL 140/EIL 145/cathode 150 forms the OLED. To protect this, the capping layer 160 is formed. The capping layer 160 may include 8-Quinolinolato Lithium, N,N-diphenyl-N,N-bis(9-phenyl-9H-carbazol-3-yl)biphenyl-4,4'-diamine, N(diphenyl-4-yl)9,9-dimethyl-N-(4(9-phenyl-9H-carbazol-3-yl) phenyl)-9H-fluorene-2-amine, or 2-(4-(9,10-di(naphthalene-2-yl)anthracene-2-yl)phenyl)-1-phenyl-1H-benzo-[D] imidazole, and may be a compound of transition metal, alkali and alkali earth metal of one of inorganics CuI, CuBr, CuCl, AgI, AgBr, AgCl, ZnS, $AlF_3$, NaI, KI, RbI, CsI, MgTe, CaTe and SrTe, but is not limited thereto. In this instance, the encapsulation 165 may be polymer-based organics including acryl-based resin, epoxy-based resin, polyimide and polyethylene, oxide of at least one of $Al_2O_3$, $TiO_2$, $ZrO$, $SiO_2$, AlON, SiON, ZnO and $Ta_2O_5$, a nitride-based composite layer of at least one of GaN, $GeN_x$, $SiN_x$, $GeSiN_x$, $GaSiN_x$, InN and CrN, a compound of transition metal and alkali, alkali earth metal of one of CuI, CuBr, CuCl, AgI, AgBr, AgCl, ZnS, $AlF_3$, NaI, KI, RbI, CsI, MgTe, CaTe and SrTe, and multilayer or glass substrate.

Additionally, the active layer according to the present disclosure (the active layer 30a, 30b, 30c, 30d described with reference to FIGS. 2 to 5) may be included in one of the capping layer 160, the encapsulation 165 and the color filter 170, or the active layer may be included in the interface within the stack structure of the capping layer 160, the encapsulation 165 and the color filter 170. The active layer may have the emission wavelength of 400~750 nm at UV or blue excitation wavelength.

For example, as shown in FIG. 6, the active layer 155 may be disposed below the capping layer 160. Alternatively, the active layer may be included in the capping layer 160 or may be disposed above the capping layer 160. As another example, the corresponding active layer may be included in the encapsulation 165 or may be disposed above or below the encapsulation 165. As still another example, the corresponding active layer may be included in the color filter 170 or may be disposed above or below the color filter 170. In this embodiment, the active layer converts the wavelength to, for example, blue or green, using UV or blue light from the EML 135 as an excitation light source. In a real photoconversion device, EML (UV, blue emitting layer, IR emitting layer) 135 may include an optical device such as inorganic LED, OLED, QLED and perovskite LED, but further, as described with reference to FIG. 1, the photoconversion device may be implemented using the LED including the active layer according to the present disclosure as a light source.

Figure 7:
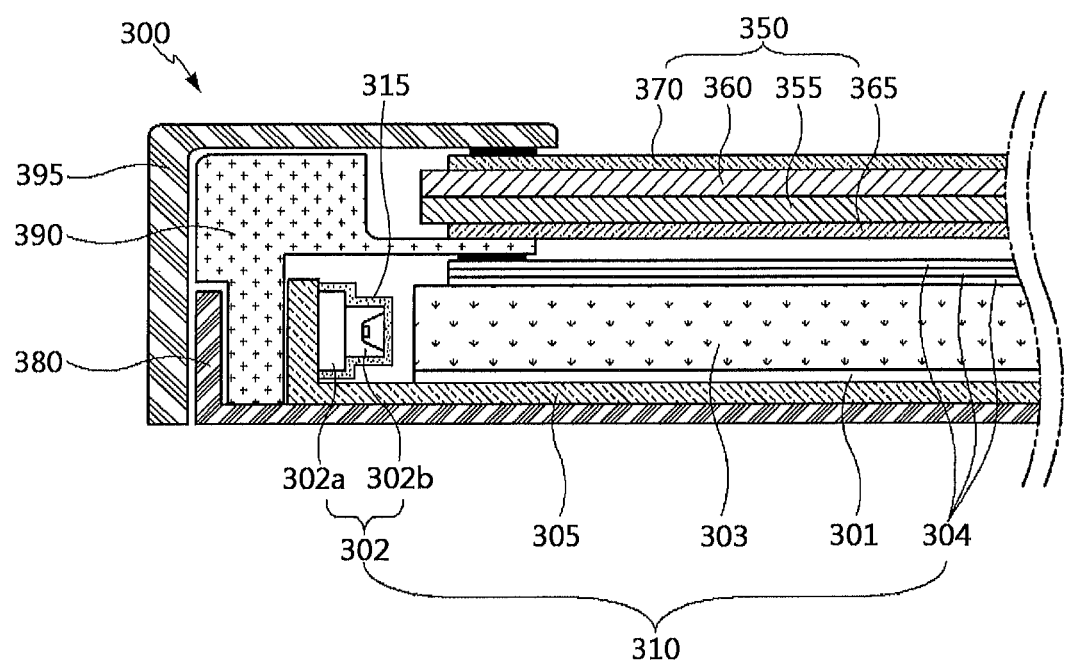
FIG. 7 is a schematic cross-sectional view showing another photoconversion device including an active layer according to the present disclosure.

FIG. 7 is a schematic cross-sectional view showing another photoconversion device including an active layer according to the present disclosure, showing an LCD device-based photoconversion device.

As shown in FIG. 7, the photoconversion device 300 of the present disclosure is an LCD-based photoconversion device in which a backlight unit 310 and a liquid crystal panel 350 are integrated, and the active layer may be included in the backlight unit 310 or the liquid crystal panel 350.

In the shown example; the photoconversion device 300 includes the liquid crystal panel 350, the backlight unit 310, a cover bottom 380, a guide panel 390 and an upper case 395.

The liquid crystal panel 350 includes a TFT substrate 355 and a color filter substrate 360 laminated facing each other, with a liquid crystal layer interposed between. Additionally, polarization films 365, 370 may be attached to the lower surface and the upper surface of the liquid crystal panel 350. Additionally, the backlight unit 310 includes a reflective sheet 301, a light source 302 to provide light to the liquid crystal panel 350, a light guide plate 303, a plurality of optical sheets 304, and a housing 305 to support the light source 302.

The cover bottom 380 has a receiving space inside, and receives the light source 302, the reflective sheet 301, the light guide plate 303 and the optical sheets 304 and supports the guide panel 390. The guide panel 390 is configured to support the liquid crystal panel 350, and may include a panel support to support the liquid crystal panel 350 and sidewalls to cover the backlight unit 310 as shown in FIG. 7. The upper case 395 covers the edges of the upper surface of the liquid crystal panel 350 and the sides of the guide panel 390 and the cover bottom 380.

The active layer (active layer 30a, 30b, 30c, 30d described with reference to FIGS. 2 to 5) may be included on the light guide plate 303 or the light source 302, and the active layer may be included as a separate film covered with a barrier film or may be deposited directly on the light guide plate 303 or the light source 302. In this embodiment, the active layer 315 deposited directly on the light source 302 is taken as an example. As another example, the active layer may be included in the color filter substrate 360 or may be an alternative to the color filter substrate 360. The material for the barrier film includes an inorganic insulating material (ZnO, $TiO_2$, $ZrO_2$, CuI, ZnS, MgTe, GaN, $Al_2O_3$, $SiO_2$, GaN, SiON, $GeN_x$, $SiN_x$), an acryl-based organic compound having a low dielectric constant, and an organic insulating material such as BCB or PFCB.

The active layers in the embodiments described with reference to FIGS. 6 and 7 have the same composition or fabrication method as the active layer 30a, 30b, 30c, 30d described with reference to FIGS. 2 to 5, and an only difference is photoconversion by an excitation light source, not emission by electron and hole injection. As described above, according to the present disclosure, the active layer of lanthanum-based metal or transition metal-based multiple quantum well structure can be formed using a raw material having good reactivity such as a halide raw material by a method such as a thermal evaporation method of low process temperature of about 200° C. The optoelectronic device including this active layer can be entirely formed from an inorganic material, and without harmful substance for human body such as Cd and Pb, a low temperature process is possible. In particular, through an appropriate material-based combination, it is possible to implement a photoconversion device with 420~470 nm emission wavelength at near UV or blue excitation wavelength, and implement a blue device that does not exist in existing OLEDs or QLEDs. Because the present disclosure is fabricated based on inorganics, it is less vulnerable to temperature and moisture than OLEDs. Because single crystal growth is not necessarily required, it is possible to fabricate an areal emission device without limitation on the substrate. Additionally, because it can be fabricated by a vacuum processing method, the application of mass production is easier than that of a solution processing method.

In the previous embodiments, it was mentioned that the well 31 in type 1 device and the active layer 34, 36 in type 2 device may include an organic emissive dopant. The organic emissive dopant refers to a (red, green, blue) fluorescent and phosphorescent dopant used in OLEDs, and high efficiency organic dopants are commercially available and well-known.

In the case of OLEDs, failure to introduce phosphorescence into blue is because it is difficult to manufacture a stable phosphorescent host having higher singlet energy level than emission energy (S1 and T1 of the host material are higher than S1 and T1 of the dopant). Additionally, thermally activated delayed fluorescence (TADF) fabricated as an alternative to blue phosphorescence exploits re-intersystem crossing from T1 exciton to S1 level due to a small difference between S1 and T1, and in this case, molecular configuration is stereoscopically twisted, and molecules are unstable and more susceptible to transformation, causing device degradation.

The well 31 in type 1 device and the active layer 34, 36 in type 2 device correspond to an inorganic host having high thermal stability, high charge mobility and high singlet and triplet energy levels. For the well 31 in type 1 device and the active layer 34, 36 in type 2 device, lanthanum-based metal may be used. The lanthanum-based metal used in the present disclosure is at least one of La, Ce, Pr, Nd, Pm, Sm, Eu, Gd, Tb, Dy, Ho, Er, Tm, Yb and Lu, and is rare earth metal of atomic numbers 57 to 71. The lanthanum-based metal has various 4f levels within the semiconductor or dielectric. Accordingly, singlet to triplet or triplet to singlet intersystem crossing by strong spin-orbital coupling effect is possible, which helps the intersystem crossing of the organic emissive dopant, achieving stable and high emission efficiency.

The spin-orbital coupling gets involved in spin angular momentum and orbital angular momentum, Coupling means that unique behaviors of the spin are disturbed because the spin direction is affected by the adjacent magnetic field generated by the orbital.

The spin angular momentum has a nearly linear relationship with the number of unpaired electrons, but even with the increasing atomic number, there is no big change in size and there is no influence on spin-orbital coupling.

The orbital angular momentum occurs due to precession of electrons around a specific orbit. According to atomic radius as a function of atomic number using the Bohr model of the atom, in the atomic number 30 or below, the atomic radius increases almost linearly with the atomic number, while in the atomic number 30 or above, the atomic radius does not almost change even with the increasing atomic number. Accordingly, as the atomic number is larger, the velocity of electron orbiting increases rapidly.

The motion of electrons induces an electric current and the electric current induces a magnetic field, and as a result, as the atomic number increases, a large magnetic field is induced by the precession motion of electrons. The resulting magnetic field forms a pair with spin angular momentum and orbital angular momentum to form the total angular momentum, and due to coupling between them, the total angular momentum is conserved no longer. Accordingly, due to spin-orbital coupling, spin quantum number is poor quantum number, and spin-forbidden transition may occur.

The size of spin-forbidden transition is nearly proportional to the size of transition dipole moment, and as the atomic number is larger, with the increasing spin-orbital coupling, there is an increasing tendency. Accordingly, as the atomic number is larger, intersystem crossing of singlet to triplet or triplet to singlet occurs quickly.

As described above, when the organic emissive dopant is included in the well 31, of type 1 device and the active layer 34, 36 of type 2 device, the optoelectronic device can be implemented with high efficiency and long lifetime. A typical example of the organic emissive dopant includes at least one of atomic number 76 Os, atomic number 77 Ir and atomic number 78 Pt. For example, as a blue organic emissive dopant and a red organic emissive dopant, SMD3 and RD354 are known.

Hereinafter, the present disclosure will be described in more detail by specifically describing the experimental example of the present disclosure. In the experimental example of the present disclosure, LED was fabricated.

Figure 8:
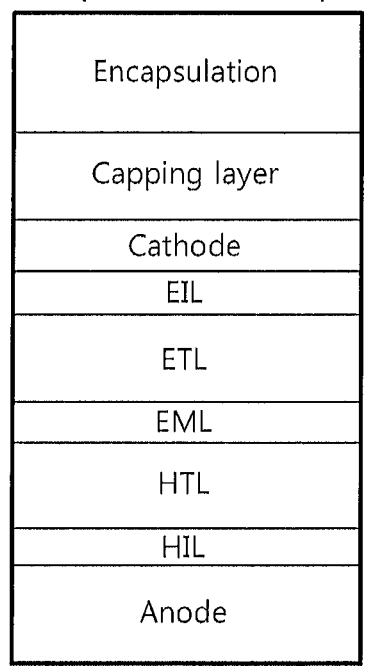
FIG. 8 is a schematic cross-sectional view of a comparative example LED fabricated in the present disclosure experimental example.
Figure 9:
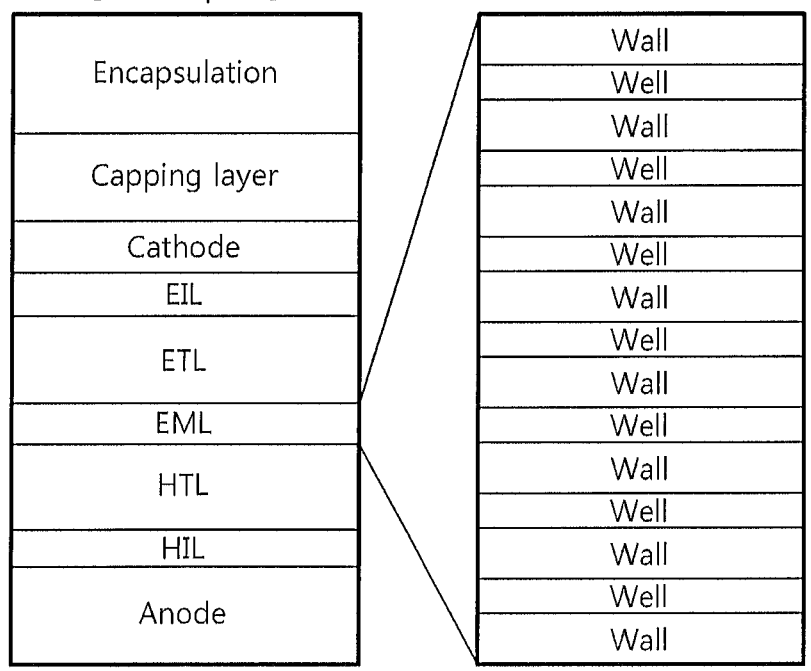
FIG. 9 is a schematic cross-sectional view of an example LED fabricated in the present disclosure experimental example.

FIG. 8 shows a structure with no wall in forming EML and corresponds to comparative example, and FIG. 9 is a device corresponding to an example of the present disclosure including EML of multiple quantum well structure as described with reference to FIG. 2.

The devices of FIGS. 8 and 9 have all the structure of anode/HIL/HTL/EML/ETL/EIL/cathode and even capping layer/encapsulation thereon as described with reference to FIG. 1.

The comparative example device of FIG. 8 has EML formed with a well composition alone without wall, and the device of FIG. 9 has a multiple quantum well structure including seven layers of repeating structure of wall/well as shown in the enlarged view of the EML part.

In the experimental example, the anode was formed from ITO 100 Å/Ag 1000 Å/ITO 100 Å/. HIL was formed from an organic HTL material HT211:CuI (5 vol %) 100 Å. HTL was formed from HT211 1130 Å. EML was formed from 210 Å. ETL was formed from NET164:Liq(360 Å). EIL was formed from Yb:CsCl (10 vol %) 13 Å. The cathode was formed from Ag:Mg (10 vol %) 90 Å. The capping layer was formed from CsCl/CuI 700 Å. The encapsulation was formed from a thin film or glass. In the repeating structure of wall/well, the wall was formed 10~50 Å thick and the well was 5~40 Å thick, and EML of the example device was 230~300 Å thick. EML was formed by co-deposition using a thermal evaporation method. EML was formed along the emitting layer, and was exposed to an oxygen atmosphere to activate the reaction.

Tables 1 to 5 summarize the results of evaluating the emission properties according to the composition of well and wall.

TABLE 1

| Case in which transition metal halide CuI is used for well | | | | | |
|---|---|---|---|---|---|
| Well | Wall | Sample number | Wavelength (nm) | Operating voltage (V) | Efficiency (cd/A) |
| CuI (210 Å) | none | Comparative example1 | 422 | 5.2 | 1 |
| CsI:CuI (210 Å) | none | Comparative example2 | | | Not lit |
| CaI$_2$:CuI (210 Å) | none | Comparative example3 | | | Not lit |
| CsCaI$_3$:CuI (210 Å) | none | Comparative example4 | | | Not lit |
| CuI (10 Å) | CsI (20 Å) | Example1 | 415 | 3.5 | 15 |
| CuI (10 Å) | CaI$_2$ (20 Å) | Example2 | 415 | 3.7 | 13 |
| CsI:CuI (20 Å) | CsI (20 Å) | Example3 | | | Not lit |
| CaI$_2$:CuI (20 Å) | CaI$_2$ (20 Å) | Example4 | | | Not lit |
| CsCaI$_3$:CuI (20 Å) | CsI (20 Å) | Example5 | | | Not lit |

First, Table 1 shows the case in which transition metal halide CuI is used for the well. Comparative example 1 uses CuI alone for the active layer, and 422 nm emission was observed at the operating voltage of 5.2. V. The measured efficiency was 1 (cd/A). Comparative examples 2 to 4 were doped using dielectric host such as CsI, CaI$_2$, CsCaI$_3$ and CuI activator, and did not light up in the operating voltage range of the experiment.

Examples 1 to 5 use dielectric such as CsI or CaI$_2$ for the wall. Examples 1 and 2 uses CuI alone for the well like comparative example 1, and each achieves emission properties showing efficiency of 15 and 13 (cd/A). This efficiency is larger ten or more times than comparative example 1 using the same well. Additionally, the operating voltage is low compared to comparative example 1. Additionally, light is emitted at shorter wavelength. Examples 3 to 5 were doped using dielectric host such as CsI, CaI$_2$, CsCaI$_3$ and CuI activator, and did not light up in the operating voltage range of the experiment.

TABLE 2

| Case in which transition metal halide AgI is used for well | | | | | |
|---|---|---|---|---|---|
| Well | Wall | Sample number | Wavelength (nm) | Operating voltage (V) | Efficiency (cd/A) |
| AgI (210 Å) | none | Comparative example5 | 445 | 5 | 1.2 |
| CsI:AgI(210 Å) | none | Comparative example6 | | | Not lit |

TABLE 2-continued

Case in which transition metal halide AgI is used for well

| Well | Wall | Sample number | Wavelength (nm) | Operating voltage (V) | Efficiency (cd/A) |
|---|---|---|---|---|---|
| $CaI_2$:AgI(210 Å) | none | Comparative example7 | | | Not lit |
| $CsCaI_3$:AgI (210 Å) | none | Comparative example8 | | | Not lit |
| AgI (10 Å) | CsI (20 Å) | Example6 | 438 | 3.4 | 17 |
| AgI (10 Å) | $CaI_2$ (20 Å) | Example7 | 438 | 3.5 | 14 |
| CsI:AgI (20 Å) | CsI (20 Å) | Example8 | | | Not lit |
| $CaI_2$:AgI (20 Å) | $CaI_2$ (20 Å) | Example9 | | | Not lit |
| $CsCaI_3$:AgI (20 Å) | CsI (20 Å) | Example10 | | | Not lit |

Next, Table 2 shows the case in which transition metal halide AgI is used for the well. Comparative example 5 uses AgI alone for the active layer, and 445 nm emission was observed at the operating voltage 5V. The measured efficiency was 1.2 (cd/A). Comparative examples 6 to 8 were doped using dielectric host such as CsI, $CaI_2$, $CsCaI_3$ and AgI activator, and did not light up in the operating voltage range of the experiment.

Examples 6 to 10 use dielectric such as CsI or $CaI_2$ for the wall. Examples 6 and 7 use AgI alone for the well like comparative example 5, and each achieves emission properties showing in efficiency of 17 and 14 (cd/A). This efficiency is larger ten or more times than comparative example 5 having the same well. Additionally, the operating voltage is low compared to comparative example 5. Additionally, light is emitted at shorter wavelength. Examples 8 to 10 were doped using dielectric host such as CsI, $CaI_2$, $CsCaI_3$ and AgI activator, and did not light up in the operating voltage range of the experiment.

From the results of Tables 1 and 2, when transition metal halide is used for the well, in comparison of comparative example 1 and examples 1 and 2, and in comparison of comparative example 5 and examples 6 and 7, it can be seen that even though the same well is used, the device fabricated with a wall/well structure has emission properties with higher efficiency at lower operating voltage. Additionally, in the examples, emission only occurs in examples 1, 2, 6 and 7 using CuI, AgI alone for the well, and in the transition metal halide, in the case of CuI and AgI that were directly used in the experiment, it was found advantageous for emission when used alone to form the well than when doped in the host. The transition metal halide other than these may have emission properties even when doped in the host.

TABLE 3

Case in which lanthanum-based metal halide $EuI_2$ is used for well($EuI_2$ doping = 3 mol %)

| Well | Wall | Sample number | Wavelength (nm) | Operating voltage (V) | Efficiency (cd/A) |
|---|---|---|---|---|---|
| $EuI_2$ (210 Å) | none | Comparative example9 | 428 | 8 | 0.1 |
| CsI:$EuI_2$ (210 Å) | none | Comparative example10 | 430 | 4.2 | 6.6 |
| $CaI_2$:$EuI_2$ (210 Å) | none | Comparative example11 | 431 | 4 | 7.8 |
| $CsCaI_3$:$EuI_2$ (210 Å) | none | Comparative example12 | 425 | 3.7 | 9.2 |
| $EuI_2$ (10 Å) | CsI (20 Å) | Example11 | 421 | 3.5 | 13.1 |
| $EuI_2$ (10 Å) | $CaI_2$ (20 Å) | Example12 | 421 | 3.6 | 11.7 |
| CsI:$EuI_2$ (20 Å) | CsI (20 Å) | Example13 | 430 | 3.6 | 10 |
| $CaI_2$:$EuI_2$ (20 Å) | $CaI_2$ (20 Å) | Example14 | 431 | 3.5 | 12.5 |
| $CsCaI_3$:$EuI_2$ (20 Å) | CsI (20 Å) | Example15 | 425 | 3.5 | 13.7 |

Table 3 shows the case in which lanthanum-based metal halide $EuI_2$ is used for the well. When $EuI_2$ is used as activator, the doping concentration was 3 mol %. Comparative example 9 uses $EuI_2$ along for the active layer, and comparative examples 10 to 12 were doped using dielectric host such as CsI, $CaI_2$, $CsCaI_3$ and $EuI_2$ activator. In all comparative examples 9 to 12, the emission wavelength around 400 nm was observed and efficiency was lower than 9.2 (cd/A).

Examples 11 to 15 use dielectric CsI or $CaI_2$ for the wall. Examples 11 and 12 use $EuI_2$ alone for the well like comparative example 9, and examples 13 to 15 were doped using dielectric host such as CsI, $CaI_2$, $CsCaI_3$ and $EuI_2$ activator. In all examples 11 to 15, the emission wavelength around 400 nm was observed, and the operating voltage is on lower level than comparative examples and efficiency is all 10 (cd/A) or above. In addition, in comparison of comparative example 9 and examples 11 and 12 using the same well, in comparison of comparative example 10 and example 13 using the same well, in comparison of comparative example 11 and example 14 using the same well, and in comparison of comparative example 12 and example 15 using the same well, it can be seen that even though the same well is used, the device fabricated with a wall/well structure has emission properties with higher efficiency at lower operating voltage.

TABLE 4

Case in which lanthanum-based metal halide
SmI$_2$ is used for well(SmI$_2$ doping = 0.5 mol %)

| Well | Wall | Sample number | Wavelength (nm) | Operating voltage (V) | Efficiency (cd/A) |
|---|---|---|---|---|---|
| SmI$_2$ (210 Å) | none | Comparative example13 | 750 | 8.7 | 0.05 |
| CsI:SmI$_2$ (210 Å) | none | Comparative example14 | 650 | 4.7 | 15 |
| CaI$_2$:SmI$_2$ (210 Å) | none | Comparative example15 | 652 | 4.6 | 19.5 |
| CsCaI$_3$:SmI$_2$ (210 Å) | none | Comparative example16 | 647 | 4.4 | 25.2 |
| SmI$_2$ (10 Å) | CsI (20 Å) | Example16 | 740 | 4.7 | 18.7 |
| SmI$_2$ (10 Å) | CaI$_2$ (20 Å) | Example17 | 740 | 4.8 | 16.6 |
| CsI:SmI$_2$ (20 Å) | CsI (20 Å) | Example18 | 650 | 4.6 | 19 |
| CaI$_2$:SmI$_2$ (20 Å) | CaI$_2$ (20 Å) | Example19 | 652 | 4.5 | 22 |
| CsCaI$_3$:SmI$_2$ (20 Å) | CsI (20 Å) | Example20 | 647 | 4.2 | 28.6 |

Table 4 shows the case in which lanthanum-based metal halide SmI$_2$ is used for the well. When SmI$_2$ is used as activator, the doping concentration was 0.5 mol %. Comparative example 13 uses SmI$_2$ alone for the active layer, and comparative examples 14 to 16 were doped using dielectric host such as CsI, CaI$_2$, CsCaI$_3$ and SmI$_2$ activator. In all comparative examples 13 to 16, the emission wavelength of 647~750 nm was observed.

Examples 16 to 20 use dielectric such as CsI or CaI$_2$ for the wall. Examples 16 and 17 use SmI$_2$ alone for the well like comparative example 13, and examples 18 to 20 were doped using dielectric host such as CsI, CaI$_2$, CsCaI$_3$ and SmI$_2$ activator. All examples 16 to 20 have emission wavelength in the similar range to comparative examples 13 to 16 and operating voltage on lower level than comparative examples. In the same way as the previous results, in comparison of comparative example 13 and examples 16 and 17 using the same well, in comparison of comparative example 14 and example 18 using the same well, in comparison of comparative example 15 and example 19 using the same well, and in comparison of comparative example 16 and example 20 using the same well, it can be seen that even though the same well is used, the device fabricated with a wall/well structure has emission properties with higher efficiency at lower operating voltage.

From the results of Tables 3 and 4, it can be seen that when lanthanum-based metal halide is used for the well, even though the same well is used, the device fabricated with a wall/well structure has emission properties with higher efficiency at lower operating voltage. Additionally, because all examples showed emission in the range of 421~740 nm, it can be seen that in the lanthanum-based metal halide, EuI$_2$ and SmI$_2$ directly used in the experiment can form the well whether alone or doped in the host.

In comparison of examples 11 and 13, in the case of CsI doped using EuI$_2$ activator, there is a change toward larger emission wavelength than when EuI$_2$ is used alone. However, when comparing example 16 and example 18, in the case of CsI doped using SmI$_2$ activator, there is a change toward lower emission wavelength than when SmI$_2$ is used alone. From the foregoing, it can be seen that changes and combinations of the host material and the activator material result in emission properties of various wavelength ranges.

TABLE 5

Case in which lanthanum-based metal halide
EuI$_2$ is used for well(EuI$_2$ doping = 3 mol %)

| Well | Wall | Sample number | Wavelength (nm) | Operating voltage (V) | Efficiency (cd/A) |
|---|---|---|---|---|---|
| EuI$_2$ (210 Å) | none | Comparative example17 | 428 | 8 | 0.1 |
| CaS:EuI$_2$ (210 Å) | none | Comparative example18 | 652 | 4 | 10.5 |
| CaSe:EuI$_2$ (210 Å) | none | Comparative example19 | 597 | 4.2 | 15 |
| CaS:EuI$_2$ (20 Å) | CsI (20 Å) | Example 21 | 647 | 3.6 | 20 |
| CaSe:EuI$_2$ (20 Å) | CsI (20 Å) | Example 22 | 588 | 3.7 | 25 |

Tables 1 to 4 show the case in which the host is alkali metal or alkali earth metal halide. Table 5 shows the case in which the host is alkali earth metal chalcogenide.

Referring to Table 5, comparative example 18 and example 21 have the same well type, and comparative example 19 and example 22 have the same well type. It can be seen again that in each comparison, in the case of examples, light is emitted with high efficiency at low operating voltage.

As can be seen from the above experimental example, fabrication with a multiple quantum well structure results in remarkably improved emission efficiency and emission properties of various wavelength ranges at low operating voltage. The efficiency of the example device showing blue emission is generally 10 cd/A or above, which is on higher level than the fluorescence and phosphorescence efficiency of existing OLEDs, and the lifetime is 100 hours on the basis of 95% and is very stable. As described above, according to the present disclosure, the active layer of excellent emission properties can be formed using a halide raw material by a method such as a thermal evaporation method of low process temperature of about 200° C., and the optoelectronic device including this active layer can be entirely formed from an inorganic material, and without harmful substance for human body such as Cd, a low temperature process is possible.

As another example of the present disclosure, for the well including an organic emissive dopant, emission properties were evaluated and summarized in the following Tables 6 to 0.9. Devices that are the same as the devices of sample number examples 1, 2, 6, 7, 13-15, 18-20 in the previous examples and include an active layer including a blue organic emissive dopant or a red organic emissive dopant were labeled sample number examples 1', 2', 6', 7', 13'-15', 18'-20'. For the organic emissive dopant, commercial products SMD3 and RD354 were used, and it was present in an amount of 3 vol % relative to the host.

TABLE 6

Case in which transition metal halide CuI is used for well

| Well | Wall | Sample number | Wavelength (nm) | Operating voltage (V) | Efficiency (cd/A) |
| --- | --- | --- | --- | --- | --- |
| CuI (10 Å) | CsI (20 Å) | Example1 | 415 | 3.5 | 15 |
| CuI (10 Å) | CaI$_2$ (20 Å) | Example2 | 415 | 3.7 | 13 |
| CuI (10 Å): Blue organic emissive dopant | CsI (20 Å) | Example1' | 435 | 3.4 | 18 |
| CuI (10 Å): Blue organic emissive dopant | CaI$_2$ (20 Å) | Example2' | 435 | 3.5 | 15 |

TABLE 7

Case in which transition metal halide AgI is used for well

| Well | Wall | Sample number | Wavelength (nm) | Operating voltage (V) | Efficiency (cd/A) |
| --- | --- | --- | --- | --- | --- |
| AgI (10 Å) | CsI (20 Å) | Example6 | 438 | 3.4 | 17 |
| AgI (10 Å) | CaI$_2$ (20 Å) | Example7 | 438 | 3.5 | 14 |
| AgI (10 Å): Blue organic emissive dopant | CsI (20 Å) | Example6' | 455 | 3.4 | 18 |
| AgI (10 Å): Blue organic emissive dopant | CaI$_2$ (20 Å) | Example7' | 455 | 3.4 | 16 |

TABLE 8

Case in which lanthanum-based metal halide EuI$_2$ is used for well(EuI$_2$ doping = 3 mol %)

| Well | Wall | Sample number | Wavelength (nm) | Operating voltage (V) | Efficiency (cd/A) |
| --- | --- | --- | --- | --- | --- |
| CsI:EuI$_2$ (20 Å) | CsI (20 Å) | Example13 | 430 | 3.6 | 10 |
| CaI$_2$:EuI$_2$ (20 Å) | CaI$_2$ (20 Å) | Example14 | 431 | 3.5 | 12.5 |
| CsCaI$_3$:EuI$_2$ (20 Å) | CsI (20 Å) | Example15 | 425 | 3.5 | 13.7 |
| CsI:EuI$_2$ (20 Å): . Blue organic emissive dopant | CsI (20 Å) | Example13' | 450 | 3.5 | 11 |
| CaI$_2$:EuI$_2$ (20 Å): Blue organic emissive dopant | CaI$_2$ (20 Å) | Example14' | 448 | 3.4 | 14 |
| CsCaI$_3$:EuI$_2$ (20 Å): Blue organic emissive dopant | CsI (20 Å) | Example15' | 445 | 3.5 | 15 |

TABLE 9

Case in which lanthanum-based metal halide
$SmI_2$ is used for well($SmI_2$ doping = 0.5 mol %)

| Well | Wall | Sample number | Wavelength (nm) | Operating voltage (V) | Efficiency (cd/A) |
|---|---|---|---|---|---|
| CsI:$SmI_2$ (20 Å) | CsI (20 Å) | Example18 | 650 | 4.6 | 19 |
| $CaI_2$:$SmI_2$ (20 Å) | $CaI_2$ (20 Å) | Example19 | 652 | 4.5 | 22 |
| $CsCaI_3$:$SmI_2$ (20 Å) | CsI (20 Å) | Example20 | 647 | 4.2 | 28.6 |
| CsI:$SmI_2$ (20 Å): Red organic emissive dopant | CsI (20 Å) | Example18' | 650 | 4 | 40 |
| $CaI_2$:$SmI_2$ (20 Å): Red organic emissive dopant | $CaI_2$ (20 Å) | Example19' | 652 | 3.8 | 55 |
| $CsCaI_3$:$SmI_2$ (20 Å): Red organic emissive dopant | CsI (20 Å) | Example20' | 655 | 3.8 | 60 |

From Tables 6 to 8, the addition effect of the organic emissive dopant can be determined by comparing example number and example number' of each same number. In all cases, it can be seen that when the organic emissive dopant is added, there is an increase in emission efficiency.

This work was financially supported by the National Research Foundation of Korea (NRF) grant funded by Ministry of Science, ICT & Future Planning (MSIP) (No. 2017R1A2B3008628, 2015M3D1A1069755) and Basic Science Research Program through the NRF funded by Ministry of Education (No. 2015R1A6A1A03031833).

While embodiments of the present disclosure have been hereinabove illustrated and described, the present disclosure is not limited to the particular embodiments described above, and it is obvious to those skilled in the art that various modifications can be made to the details and embodiments without departing from the essence of the present disclosure, and such modifications fall within the scope of the appended claims.

What is claimed is:

1. An optoelectronic device including an active layer in a perovskite structure,
    wherein the active layer comprises a host and an activator doped in the host,
    wherein the host has a chemical formula of $AEH_3$, $A_2EH_4$ or $AE_2H_5$, where A is alkali metal (Li, Na, K, Rb, Cs, Fr), E is alkali earth metal (Be, Mg, Ca, Sr, Ba, Ra), and H is halogen (F, Cl, Br, I),
    wherein the activator is at least one selected from the group consisting of lanthanum-based metals, lanthanum-based metal halides and lanthanum-based metal chalcogenides.

2. The optoelectronic device according to claim 1, further including at least one dielectric layer comprising at least one selected from the group consisting of alkali metal halide, alkali earth metal halide, alkali metal chalcogenide and alkali earth metal chalcogenide with the active layer interposed between.

3. The optoelectronic device according to claim 2, wherein the dielectric has a chemical formula of AH, $A_2C$, $EH_2$ or EC, where A is alkali metal (Li, Na, K, Rb, Cs, Fr), E is alkali earth metal (Be, Mg, Ca, Sr, Ba, Ra), H is halogen (F, Cl, Br, I), and C is chalcogen (O, S, Se, Te, Po).

4. The optoelectronic device according to claim 1, wherein the active layer includes an organic emissive dopant.

5. The optoelectronic device according to claim 1, wherein the activator has a chemical formula of L, $LH_2$, $LH_3$, $LH_4$, LC, $LC_2$, or $L_2C_3$, where L is lanthanum-based metal (La, Ce, Pr, Nd, Pm, Sm, Eu, Gd, Tb, Dy, Ho, Er, Tm, Yb, Lu), H is halogen (F, Cl, Br, I), and C is chalcogen (O, S, Se, Te, Po).

6. A method for fabricating an optoelectronic device, the optoelectronic device including an active layer comprising multiple quantum wells, in which each well is defined between walls, wherein each wall is a dielectric layer selected from alkali metal halide, alkali earth metal halide, alkali metal chalcogenide and alkali earth metal chalcogenide, and wherein each well is a layer including at least one semiconductor selected from the group consisting of lanthanum-based metal halide, lanthanum-based metal chalcogenide, transition metal (including post transition metal) halide and transition metal chalcogenide,
    wherein the active layer is formed by one of a thermal evaporation method, CVD, PVD, a sintering method, a solution processing method, a precipitation method and a hot-injection method,
    wherein the optoelectronic device is an LED further including a hole transfer layer configured to supply holes to the active layer and an electron transfer layer to supply electrons to the active layer,
    wherein the method comprises:
        forming an anode on a substrate,
        performing a UV ozone treatment, an oxygen and hydrogen plasma treatment and a halogen surface treatment on a surface of the anode, and
        subsequently forming the hole transfer layer, the active layer and the electron transfer layer.

7. The method for fabricating an optoelectronic device according to claim 6, wherein the well is a layer doped with an activator selected from lanthanum-based metal, transition metal, the semiconductor and a nitrogen group compound of transition metal using the dielectric as host, and
    while a raw material of the wall is continuously supplied, the activator is supplied by a pulse method through on/off adjustment of the supply of the activator to repeatedly form the wall and the well.

8. A method for fabricating an optoelectronic device, the optoelectronic device including an active layer comprising multiple quantum wells, in which each well is defined between walls, wherein each wall is a dielectric layer selected from alkali metal halide, alkali earth metal halide, alkali metal chalcogenide and alkali earth metal chalcogenide, and wherein each well is a layer including at least one semiconductor selected from the group consisting of lanthanum-based metal halide, lanthanum-based metal chalcogenide, transition metal (including post transition metal) halide and transition metal chalcogenide, wherein the active layer is formed by one of a thermal evaporation method, CVD, PVD, a sintering method, a solution processing method, a precipitation method and a hot-injection method, wherein the method further comprises performing an oxygen treatment to of the active layer.

* * * * *